(12) United States Patent
Taravade et al.

(10) Patent No.: US 6,775,818 B2
(45) Date of Patent: Aug. 10, 2004

(54) DEVICE PARAMETER AND GATE PERFORMANCE SIMULATION BASED ON WAFER IMAGE PREDICTION

(75) Inventors: Kunal Taravade, Portland, OR (US); Neal Callan, Lake Oswego, OR (US); Nadya Strelkova, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 12 days.

(21) Appl. No.: 10/223,931

(22) Filed: Aug. 20, 2002

(65) Prior Publication Data

US 2004/0040000 A1 Feb. 26, 2004

(51) Int. Cl.[7] ............................................. G06F 17/25
(52) U.S. Cl. ........................... 716/21; 716/19; 716/20; 703/14
(58) Field of Search ...................... 703/14, 13; 716/19, 716/20, 21; 385/24

(56) References Cited

U.S. PATENT DOCUMENTS

| | | | |
|---|---|---|---|
| 5,991,477 A | * | 11/1999 | Ishikawa et al. ............... 385/24 |
| 6,334,209 B1 | * | 12/2001 | Hashimoto et al. ........... 716/21 |
| 2002/0166107 A1 | * | 11/2002 | Capodieci et al. ............ 716/19 |

* cited by examiner

Primary Examiner—Thuan Do
(74) Attorney, Agent, or Firm—Suiter West PC LLO

(57) ABSTRACT

A circuit, gate, or device parameter simulation includes data on the initial conditions of manufacture, including illumination conditions on a stepper, material parameters for processing conditions, and chip layout. Optical effects and processing tolerances may be accounted for in the simulation of the final device performance characteristics. The circuit, gate, or device parameter simulation may incorporate optical proximity code software. Simulated active and passive components are generated by the circuit, gate, or device parameter simulation from the simulated patterned layers on the substrate. Feedback may be provided to the circuit, gate, or device parameter simulation to optimize performance.

26 Claims, 5 Drawing Sheets

US 6,775,818 B2

DEVICE PARAMETER AND GATE PERFORMANCE SIMULATION BASED ON WAFER IMAGE PREDICTION

FIELD OF THE INVENTION

The present invention generally relates to the field of circuit simulators, and more particularly to a circuit simulator that utilizes optical proximity correction.

BACKGROUND OF THE INVENTION

Current circuit, gate, or device parameter simulation is derived through chip geometries and layouts generated by designers before any optical corrections (such as those required for optical proximity effects) are made to the layout. Circuit, gate, or device parameter simulations are conducted at the front end of the design cycle before any photolithographic parameters that will be used in manufacturing are known. In fact, the circuit, gate, or device parameter simulations use textbook equations and do not incorporate real life effects present in rigorously derived wafer level images. Instead, the existing approaches to front end design simulations use "rule of thumb" guard bands to account for process variations that occur during the manufacture of devices, such as scaling factors of +/−10% to account for any non-idealities generated during the process of pattern transfer on the wafer. While such approximations may have been sufficient when the circuit geometries were much larger, the errors introduced are substantial with shrinking features. In some cases, these simulations diverge significantly from electrically measured values downstream after manufacturing is complete. In other cases, Monte Carlo simulations attempt to statistically predict random process variations but have no way of including systematic process variations.

Thus, as described above, existing front-end design methods for predicting gate-level and device performance do not rigorously account for systematic process effects that occur during pattern transfer to a wafer, such as optical proximity due to varying pitches, pattern density loading, or plasma loading. These effects are taken into account in lithographic simulations, which are done completely separate from front end design simulations. However, such lithographic simulations are currently used only one mask at a time. One exemplary approach is to determine the behavior of the images on the wafer through changing process conditions, such as when the focus on the stepper shifts away from a preset position. Various optical effects that occur during the lithographic pattern transfer through the stepper lens onto the wafer are not considered. Thus, the current applications of lithographic simulations are exclusively limited to predicting image quality of individual layers on the wafer. The concept of extending this to multiple layers and "connecting" them to derive electrical characteristics does not exist.

Furthermore, current front end electronic design automation (EDA) tools lack the ability to incorporate such effects and, instead, rely upon gross approximations. As a result, the predicted electrical characteristics may differ from actual wafer level results substantially.

Therefore, it would be desirable to provide a comprehensive simulation of a circuit, gate, or device parameter by including processing information of the circuit on a substrate.

SUMMARY OF THE INVENTION

Accordingly, the present invention is directed to a method and system for simulating a circuit, gate, or electrical device parameter utilizing the conditions of mask replicating onto wafer integrated circuit manufacture as part of the processing calculations.

The present invention provides a gate-specific, cell-specific or full chip transistor parametric map for designers before a mask is made. Different optical proximity correction models may be compared on this basis, such as cores, memory cells, analog blocks, and other functional modules that may violate electrical design rules for a given optical proximity correction model. Also, parasitic effects, one of the biggest drawbacks of current EDA tools, are considered. A rigorously obtained wafer level simulation (correlated and calibrated with wafer images) provides a powerful tool for static and dynamic parasitic extraction. Further, by selectively choosing the longest routing length between bottleneck logic/memory modules, worst-case delay can be calculated more accurately. This look ahead capability may also be used to make business related decisions, such as whether to use the full reticle (or mask) for a given chip or whether to restrict field size (i.e., the number of die per field) for logic modules.

The method of the present invention may also be used for fine tuning a circuit, gate, or device parameter simulation program, integrated circuit emphasis (SPICE) models, that currently takes a long time due to the need for wafer level data. The advantage of optical proximity correction code, such as the one described in U.S. Pat. No. 6,081,659, for scanning electron microscope (SEM) image calibration may be extended to use etched rather than resist images for a better prediction of the final electrical output, if needed.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The method of the present invention may use simulated wafer images to estimate device performance, store values of poly and island (as well as other layers), output generated parametric distribution, compare various optical proximity correction modes before mask development, and allow Boolean operations between images from multiple layers to represent their circuit or device functional operation. A comparison step may be made after a circuit simulation to determine if and how any conditions are to be changed before running the circuit simulation again.

Figure 1:
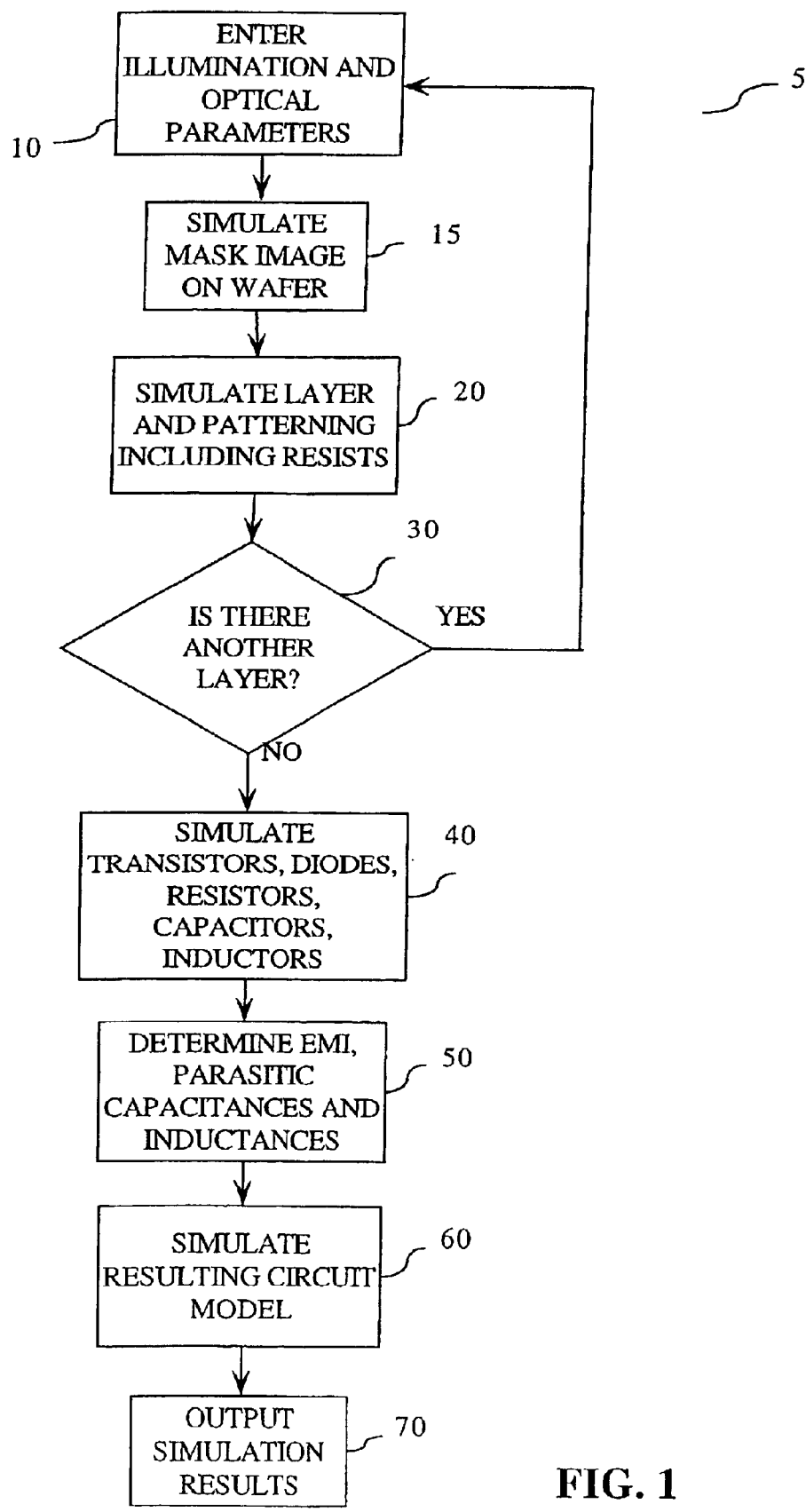
FIG. 1 illustrates an embodiment of a process of the present invention for creating a simulation of the integrated circuit layers and performing a circuit simulation on the resulting integrated circuit.

FIG. 1 illustrates an embodiment of a method 5 of the present invention. Optical parameters are provided to a processor. The optical parameters may include stepper lens description, distance of the lens from a substrate to be radiated, the wavelength of the radiation, the intensity of the radiation, the duration of the radiation, the geometry of a mask, the distance of the mask from the lens, the distance of the mask from the substrate, and the like, as per step 10. The radiation may be ultraviolet, X-ray, or the like. The mask image on wafer is then simulated under said conditions and topology of pattern is determined, per step 15. The front-end-technology process step (deposition or etch, implant, etc.) may then be simulated, as per step 20. The pattern simulation involves the effects of the diffraction pattern or other optical effects of the radiation from the radiation source due to lens shape, lens topography, lens material, and the like. The effect of the radiation on a resist layer superimposed upon the layer to be patterned is simulated. Compensation for rounding of corners caused by the optical effects of the radiation may be provided through the property of the resist layer, the layout of the mask, and the like. After the FET step is simulated, a determination is made as to whether there is another step to perform, step 30. If so, the method returns to processing step 10. Otherwise, the various active and passive components, such as transistors, diodes, capacitors, resistors, and the like are determined, step 40, by a processing algorithm. Further processing may determine electromagnetic interference (EMI) effects, parasitic capacitors and inductors, and the like, step 50. The resulting circuit model is then simulated for performance characteristics, step 60, which are then output, step 70.

Figure 2:
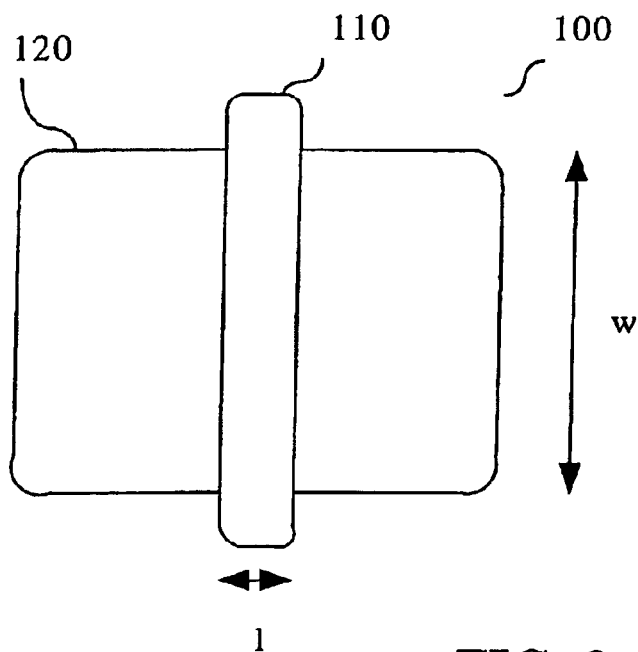
FIG. 2 illustrates an electrode over an island depicting an area of overlap that is simulated by the present invention.
Figure 3:
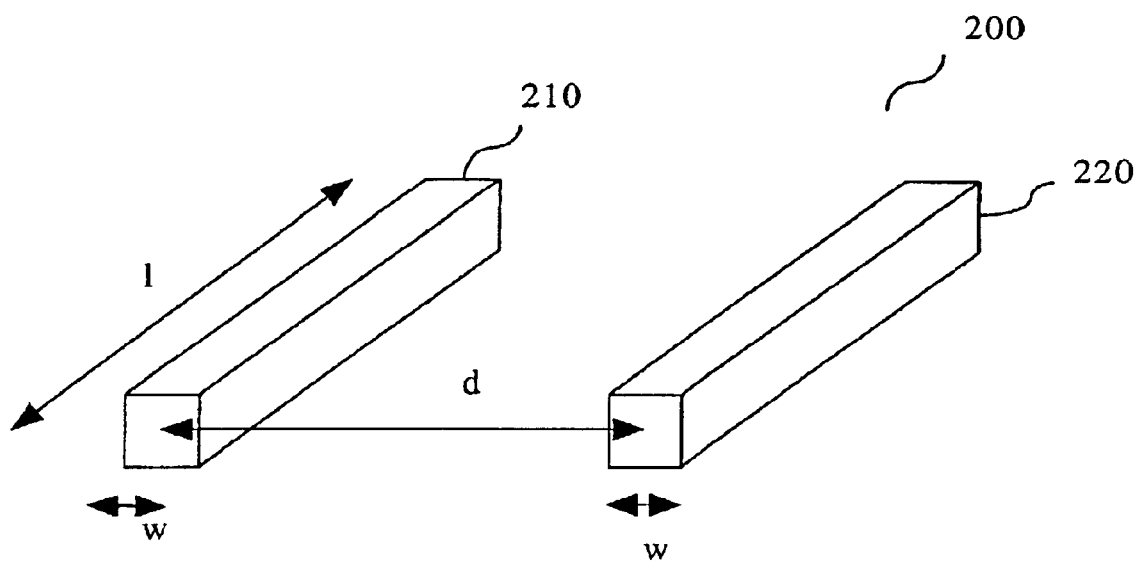
FIG. 3 illustrates the mutual inductance of parallel conductors simulated by the present invention.

FIGS. 2 and 3 are examples of the types of circuit features that are simulated by the present invention. Specifically, in FIG. 2, the relationship between the geometry of a portion of a MOSFET and a resulting saturation drain current is examined. FIG. 2 illustrates an example of a determination of electrical characteristics for an active component, as performed by step 40 of FIG. 1. In FIG. 3, parasitic inductance effects are examined, corresponding to the process step 50 of FIG. 1.

FIG. 2 illustrates an example of using layer geometry to generate an electrical characteristic of an active component. The electrical characteristics include gate level parametrics, such as turn on and turn off voltages, voltage swings, and relative voltage drops across a sandwich formed by a semiconductor/conductor layer, an insulating layer, and another semiconductor/conductor layer. Specifically, FIG. 2 shows an active portion of a transistor formed from the overlapping of a simulated island wafer image 120 and a simulated poly layer wafer image 110 (with an insulating layer between). Corresponding to processing step 40 of FIG. 1, the simulated poly wafer image 110 forms a gate electrode which overlaps the simulated island wafer image 120 to form a channel region for a metal oxide semiconductor field effect transistor (MOSFET). An important gate level parametric, the saturation drain current of the resulting MOSFET, $I_{D\ SAT}$, may be used to describe the power requirements of a transistor or the power requirements of the entire circuit. The area of overlap, calculated by the method of the present invention can then be used for calculating the effective gate length of the transistor. The saturation drain current may then be calculated because it is directly proportional to w/l. A proportionality constant may be obtained from a circuit simulation model. The saturation drain current $I_{D\ SAT}$ serves as a benchmark to measure the performance of the integrated circuit chip and affects power dissipation, frequency, noise margins, timing, and the like.

FIG. 3 illustrates an example of using layer geometry for determining parasitic electrical characteristics of a circuit, corresponding to processing step 50 of FIG. 1. For example, the mutual inductance between two parallel conductors, such as traces formed within a circuit board, may be determined. The traces 210 and 220 may be on the same level or may be on different levels. For a length l, a center to center separation distance d, and a permeability $\mu_0$ of the conductor material, the mutual inductance may be calculated as $$M = \mu_0 \frac{1}{2}\pi[1n(2l/d) - 1 + d/l].$$

Figure 4:
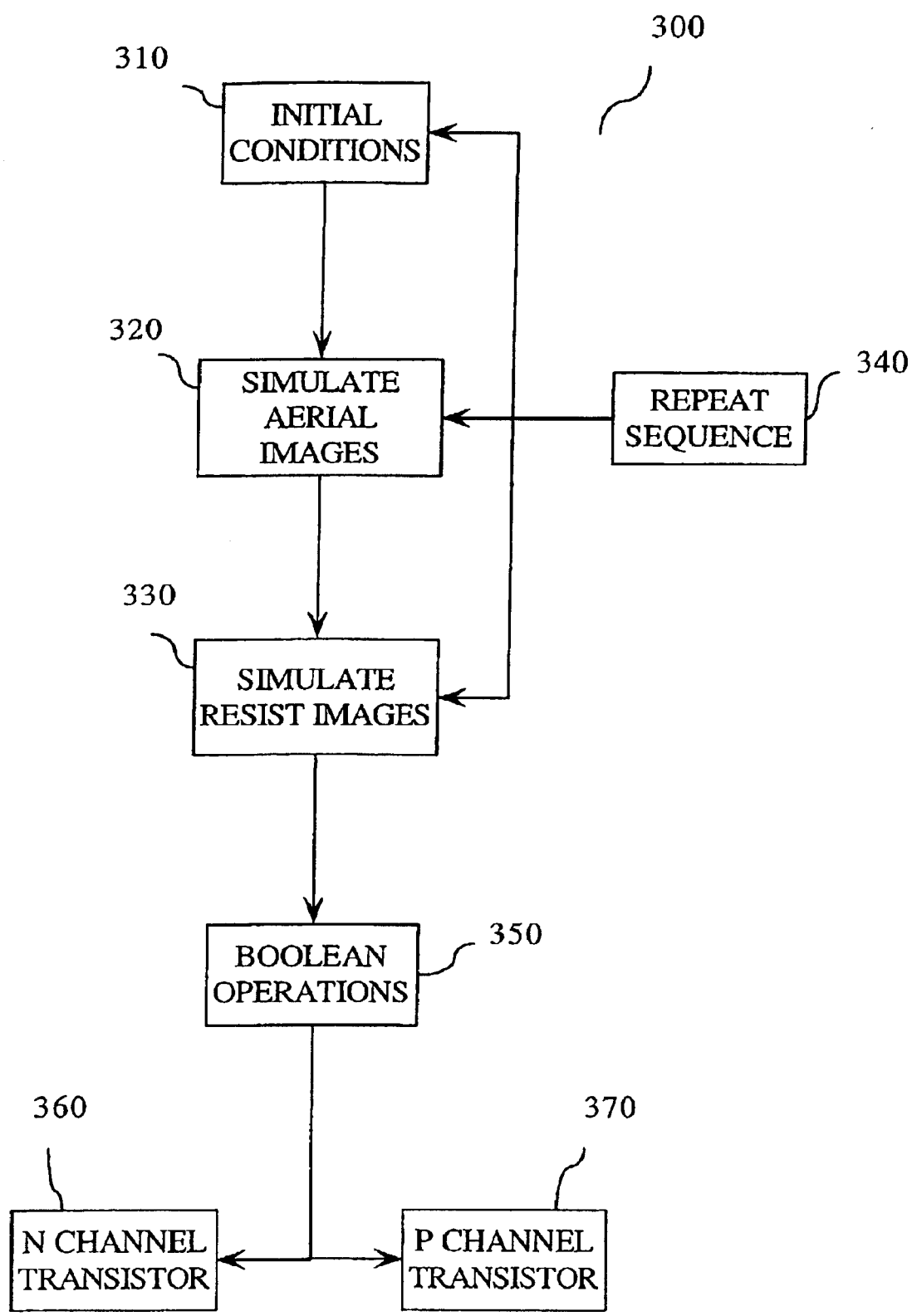
FIG. 4 illustrates another embodiment of the process of the present invention for performing Boolean operations on simulated aerial and resist images to derive components such as transistors in a circuit model.

FIG. 4 illustrates another embodiment of the method of the present invention. Initial conditions are provided, including illumination conditions on the stepper, material parameters from processing conditions, and chip layout, per step 310. An aerial image is the simulation of the pattern produced by the patterned mask with the lithography process being simulated under conditions specified by initial condition information. That is, the aerial image provides the pattern of light that strikes a topmost resist layer on the substrate after the light has passed through a mask and focusing lens. Aerial images are simulated from stepper settings, per step 320. The geometries of the wafer level resist layers are simulated from resist parameters, per step 330. The simulation of the wafer level resist layer produces a two or three dimensional map of the exposure and development of the resist layer. Processing steps 320 and 330, for example, may be accomplished as described by U.S. patent application Ser. No. 09/299,967, "Optical Proximity Correction Method and Apparatus", filed Apr. 26, 1999, now U.S. Pat. No. 6,269,472, and U.S. patent application Ser. No. 08/991,785, "Comparing Aerial Image to Actual Photoresist Pattern for Masking Process Characterization", filed Dec. 12, 1997, now U.S. Pat. No. 6,081,659, herein incorporated by reference.

The sequence of steps 310, 320, and 330 may be repeated for different front end layers, such as island, poly, thin oxide, thick oxide, and implants, per step 340. In determining devices, Boolean intersections may be performed to define the devices, per step 350. This may be accomplished through the use of simulated critical dimensions of various layers in the resist. A script may be used to perform the Boolean operations. Areas of interest may be defined in the script or as a graphical input in the graphical user interface (GUI). The data generated may be stored in a table.

Examples of the devices formed include an NMOS transistor, per step 360, and a PMOS transistor, per step 370. The NMOS transistor gate (active area) may be formed of a poly layer and an island. The NMOS transistor drain current, $I_{D\ SAT}$, is equal to $K_N(W_N/L_N)$, where K is a constant of proportionality that depends on processing conditions, including oxide thickness and doping concentrations. The PMOS transistor may, likewise, be formed of a poly layer and an island. The PMOS drain current, $I_{D\ SAT}$, is equal to $K_P(W_P/L_P)$.

The characteristics of various materials may be accounted for by the present invention. For example, electrical performance parameters may be derived for conductors formed of a metal, such as aluminum, chromium, copper, molybdenum, gold; a metal oxide, such as indium tin oxide; or another suitable conductive material. The performance characteristics of semiconductor layers, such as poly, amorphous silicon, monocrystalline silicon, and the like may be stored in a database or input to a processor. The effect of dopant levels of the semiconductor layers may also be incorporated into the processing. In a similar manner, characteristics of insulating layers, such as silicon nitride or other suitable insulating material; the starting substrate, such as an insulating material or a semiconductor material; and resist material, such as negative photoresist or positive photoresist, may be used in the simulation. Various factors in the manufacture of an integrated circuit, such as material compatibilities, etch rates of materials for particular solvents, the degree of resist hardening through lithographic parameters, the bending of material layers superimposed over patterned layers, and the like may be used in the calculation of the resulting circuit or to provide electrical parameters which describe individual components or the entire circuit.

Figure 5:
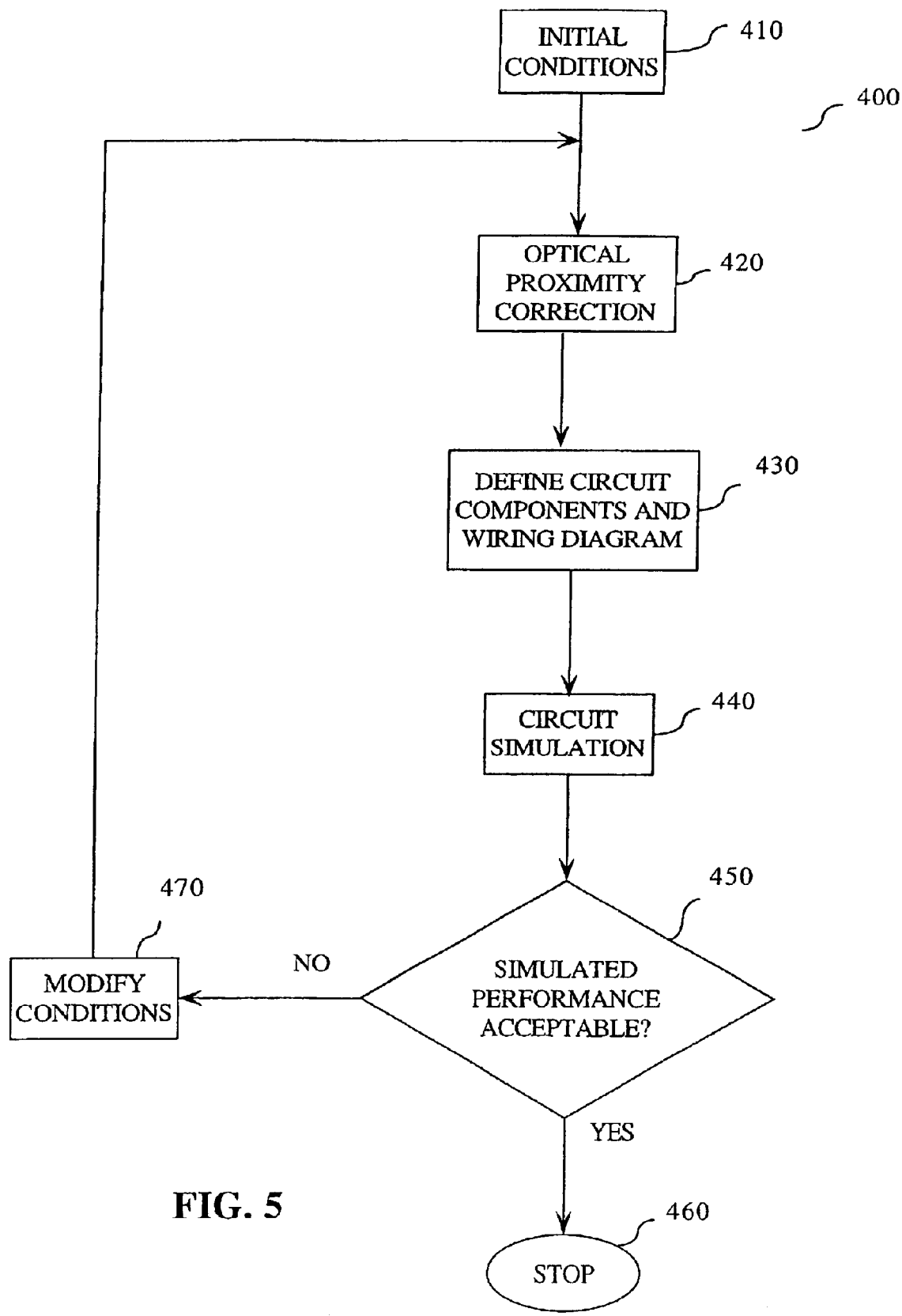
FIG. 5 illustrates yet another embodiment of the process of the present invention for iterative alteration of conditions for building the integrated circuit elements to optimize circuit model performance.

FIG. 5 illustrates another embodiment of the method of the present invention in which an iterative process is employed to optimize simulated circuit performance. The first run through of the simulation processing requires the setting of initial processing conditions, per step 410. In this embodiment, the method may compare the circuit simulation results (expected electrical characteristic values) against a benchmark or against a previous set of circuit simulation results, per step 450. If the circuit simulation results are determined to be acceptable, the simulation stops, per step 460. Acceptability may be determined by input from a user through a graphical user interface or may be determined automatically through a processing algorithm. Otherwise, the circuit simulation is repeated after modifying initial conditions, per step 470. The processing then proceeds through an optical proximity correction routine, per step 420, the definition of circuit components and wiring layout, per step 430, and another circuit simulation, per step 440. The modification of initial conditions may be performed so as to affect a single layer of material or a plurality of layers of material, as desired. For example, a conductor may be formed a few angstroms thicker, a different viscosity of resist may be used, or the intensity of the radiation source may be altered.

Variations of the above described methods are contemplated by the present invention. For example, a circuit simulator may analyze EMI effects and provide for repeating a circuit simulation under altered conditions determined by an algorithm or user to optimize circuit performance. Also, the processing steps may be streamlined as long as lithographic processing conditions are taken into account in performing a circuit simulation. Tolerance data may be manipulated to determine a probable range of circuit function.

Figure 6:
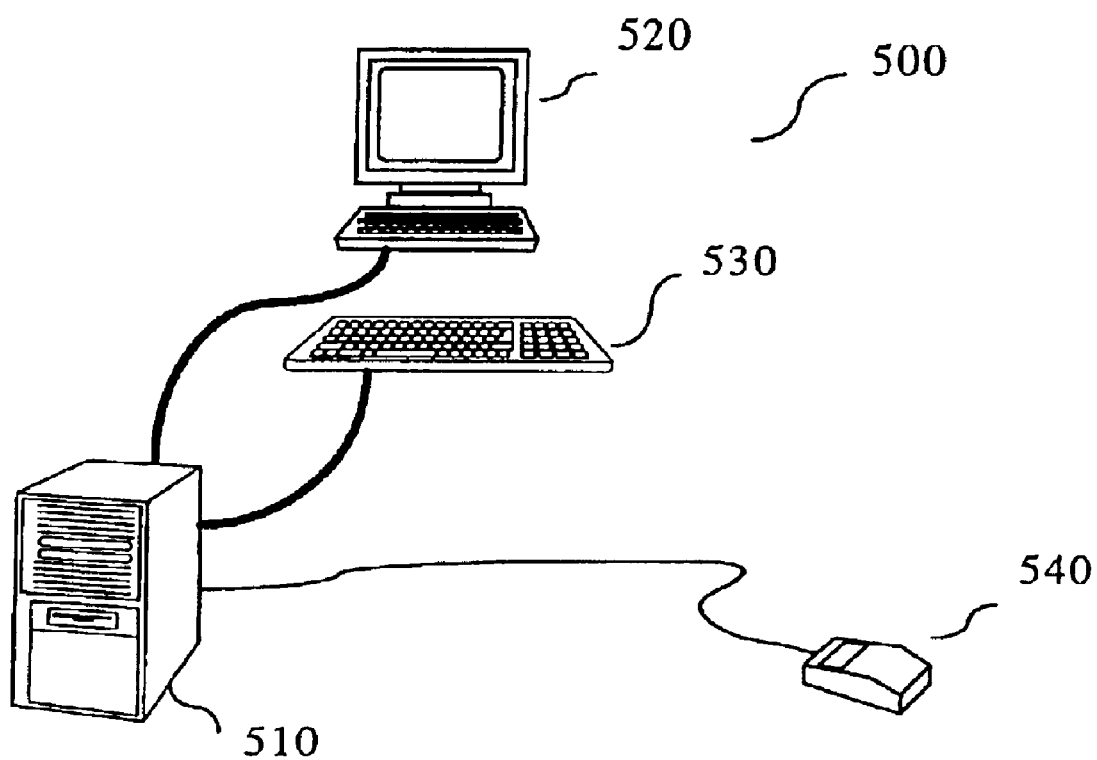
FIG. 6 illustrates a system that uses the method of the present invention.

FIG. 6 illustrates an exemplary system that uses the method of the present invention. A processor 510 may be a central processing unit of a computer. The processor 510 executes computer instructions to perform the simulation, control a graphical interface unit, and perform input and output tasks. Associated with the processor 510 is a memory which stores data representing the initial conditions in a chip manufacturing process, such as representations of masks, material characteristics, and the like. Input devices, such as a mouse 540 or keyboard 530, allow user input. A graphical user interface may be displayed on a monitor 520 for this purpose.

The graphical user interface may provide a user with a circuit diagram that is spatially related to the actual placement of components on the substrate. The graphical user interface may permit the user to rearrange the components on the substrate and, accordingly, calculate the initial conditions for achieving the rearranged layout. The graphical user interface may allow a user to change between a display of circuit elements and a layout on a substrate. Simulated performance results, such as timing diagrams and $I_{D\ SAT}$ values, may be graphically displayed.

The graphical user interface may also provide user with a window to select the materials used in the processing or with the ability to zoom in and out of the simulated layer structure on a substrate to observe a cell, a component, a group of components, or the entire chip. The GUI may permit a user to selectively add or delete layers within a defined region. For example, a user may change an aluminum drain electrode for a more complicated structure, such as a drain electrode formed of a layer of chromium and a layer of molybdenum.

The present invention may be implemented as a source code storable on a computer system to simulate a circuit by taking into account on chip circuit component geometries and materials to derive a circuit simulation. Alternatively, source code may be developed to incorporate one or more commercially available software modules, such as an optical proximity correction software module and a circuit simulation module. Bridging software may translate the output of a software module that analyzes the geometry of the conductor, semiconductor, and insulator layers and patterns, taking into account the limitations of a chosen lithographic process, to generate data representing the electrical and other characteristics of transistors, resistors, capacitors, and diodes. The electrical information may be provided to a circuit model module. The bridging software may also perform front end and/or back end processing for an optical proximity correction module and/or the circuit model module.

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method for simulating a circuit, comprising the steps of:
  receiving processing condition information;
  simulating an integrated circuit layer structure on a substrate through the processing condition information by incorporating lithographic imaging effects;
  simulating electrical characteristics of active and passive components from the simulated integrated circuit layer structure by including the lithographic imaging effects; and
  simulating circuit performance from the simulated active and passive components to generate an output.

2. The method for simulating a circuit of claim 1, wherein the processing condition information includes lithographic processing data.

3. The method for simulating a circuit of claim 2, wherein the lithographic processing data includes illumination conditions on a stepper lens, material parameters from processing conditions, and chip layout.

4. The method for simulating a circuit of claim 1, wherein the step of simulating an integrated circuit layer structure includes repeating a step of simulating a layer on a substrate.

5. The method for simulating a circuit of claim 1, further comprising the step of comparing an output of the step of simulating circuit performance from the simulated active and passive components with an output from an earlier circuit simulation in which non-identical processing data is used.

6. The method for simulating a circuit of claim 1, further comprising the step of comparing an output of the step of simulating circuit performance from the simulated active and passive components to generate an output with stored data representing benchmark data.

7. The method for simulating a circuit of claim 1, further comprising the step of simulating parasitic capacitances and inductances before the step of simulating circuit performance.

8. The method for simulating a circuit of claim 1, further comprising the step of simulating electromagnetic interference effects before the step of simulating circuit performance.

9. The method for simulating a circuit of claim 1, wherein the step of simulating an integrated circuit layer structure on a substrate includes simulating critical dimensions of various layers used in processing.

10. The method for simulating a circuit of claim 1, wherein the step of simulating active and passive components includes performing Boolean operations on the intersections of layers to define active components.

11. The method for simulating a circuit of claim 10, wherein the active components include NMOS and PMOS transistors.

12. The method for simulating a circuit of claim 1, wherein the step of simulating an integrated circuit layer structure on a substrate includes simulating an aerial image.

13. The method for simulating a circuit of claim 12, wherein the step of simulating an integrated circuit layer structure on a substrate further includes simulating a resist image.

14. A computer program of instructions storable on a medium readable by an information handling system for simulating electrical characteristics through the execution of a method, said method comprising steps of:

receiving processing condition information;

simulating an integrated circuit layer structure on a substrate through the processing condition information; and simulating electrical characteristics of active and passive components based on wafer image prediction from the simulated integrated circuit layer structure.

15. The computer program of instructions storable on a medium readable by an information handling system for simulating electrical characteristics through the execution of steps of claim 14, wherein said method further comprising the step of simulating circuit performance from simulated active and passive components corresponding to the simulated electrical characteristics.

16. The computer program of instructions storable on a medium readable by an information handling system for simulating electrical characteristics through the execution of steps of claim 14, wherein the computer program has a first portion which includes code for the step of simulating an integrated circuit layer structure and a second portion which includes code for the step of simulating electrical characteristics based upon simulated patterned layers.

17. The computer program of instructions storable on a medium readable by an information handling system for simulating electrical characteristics through the execution of steps of claim 16, wherein the first portion is a first software module and the second portion is a second software module.

18. The computer program of instructions storable on a medium readable by an information handling system for simulating electrical characteristics through the execution of steps of claim 17, wherein the computer program further comprising a third portion that interfaces both the first portion and the second portion.

19. The computer program of instructions storable on a medium readable by an information handling system for simulating electrical characteristics through the execution of steps of claim 16, wherein the first portion is an optical proximity correction module.

20. The computer program of instructions storable on a medium readable by an information handling system for simulating electrical characteristics through the execution of steps of claim 16, wherein the second portion is an electronic design automation module.

21. The computer program of instructions storable on a medium readable by an information handling system for simulating electrical characteristics through the execution of steps of claim 14, wherein said method further comprising the step of establishing active components and passive components to form a circuit model after the step of simulating an integrated circuit layer structure on a substrate through the processing condition information.

22. A system for simulating the performance of a circuit using device parameter and gate performance simulation based on wafer image prediction, comprising:

a processor which performs a simulation of electrical characteristics of active and passive components of a circuit using device parameter and gate performance based on wafer image prediction;

an input device coupled to the processor; and a display device coupled to the processor.

23. The system for simulating the performance of a circuit using device parameter and gate performance simulation based on wafer image prediction of claim 22, wherein the display device has a graphical user interface for manipulating elements of the circuit.

24. The system for simulating the performance of a circuit using device parameter and gate performance simulation based on wafer image prediction of claim 22, wherein the simulation includes Boolean operations for parallel conducting or semiconductive, electrically isolated layers that are separated by an insulating layer.

25. The system for simulating the performance of a circuit using device parameter and gate performance simulation based on wafer image prediction of claim 22, wherein the simulation incorporates an optical proximity correction module.

26. The system for simulating the performance of a circuit using device parameter and gate performance simulation based on wafer image prediction of claim 22, wherein the wafer image prediction includes an aerial image that provides a map of developed portions of a resist layer.

* * * * *